United States Patent
Bader et al.

(10) Patent No.: US 8,129,209 B2
(45) Date of Patent: *Mar. 6, 2012

(54) METHOD FOR FABRICATING A SEMICONDUCTOR COMPONENT BASED ON GAN

(75) Inventors: Stefan Bader, Eilsbrunn (DE); Dominik Eisert, Regensburg (DE); Berthold Hahn, Hemau (DE); Volker Härle, Waldetzenberg (DE)

(73) Assignee: Osram AG, München (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/648,566

(22) Filed: Dec. 29, 2009

(65) Prior Publication Data

US 2010/0200864 A1    Aug. 12, 2010

Related U.S. Application Data

(63) Continuation of application No. 10/417,611, filed on Apr. 17, 2003, now Pat. No. 7,691,656, which is a continuation of application No. PCT/DE01/03851, filed on Oct. 8, 2001.

(30) Foreign Application Priority Data

Oct. 17, 2000   (DE) .................................. 100 51 465

(51) Int. Cl.
*H01L 21/20*    (2006.01)
(52) U.S. Cl. ................................ 438/46; 257/E33.068
(58) Field of Classification Search .......... 438/459–464, 438/22–47
See application file for complete search history.

(56) References Cited

U.S. PATENT DOCUMENTS

| | | | |
|---|---|---|---|
| 3,864,819 A | 2/1975 | Ying |
| 4,170,018 A | 10/1979 | Runge |
| 4,232,440 A | 11/1980 | Bastek |
| 4,243,996 A | 1/1981 | Lebailly et al. |
| 4,448,636 A | 5/1984 | Baber |
| 4,918,497 A | 4/1990 | Edmond |
| 4,983,538 A | 1/1991 | Gotou |
| 5,040,044 A | 8/1991 | Noguchi et al. |
| 5,157,468 A | 10/1992 | Matsumoto |
| 5,210,051 A | 5/1993 | Carter, Jr. |
| 5,362,667 A | 11/1994 | Linn et al. |
| 5,373,171 A | 12/1994 | Imai et al. |

(Continued)

FOREIGN PATENT DOCUMENTS

CN    1166890    12/1997

(Continued)

OTHER PUBLICATIONS

Japanese Search Report (in English translation) dated Mar. 5, 2008 issued for the corresponding Japanese Patent Application No. 2002-537058 (pp. 3).

(Continued)

*Primary Examiner* — Savitr Mulpuri
(74) *Attorney, Agent, or Firm* — Cozen O'Connor

(57) ABSTRACT

A semiconductor component has a plurality of GaN-based layers, which are preferably used to generate radiation, produced in a fabrication process. In the process, the plurality of GaN-based layers are applied to a composite substrate that includes a substrate body and an interlayer. A coefficient of thermal expansion of the substrate body is similar to or preferably greater than the coefficient of thermal expansion of the GaN-based layers, and the GaN-based layers are deposited on the interlayer. The interlayer and the substrate body are preferably joined by a wafer bonding process.

7 Claims, 6 Drawing Sheets

U.S. PATENT DOCUMENTS

| | | |
|---|---|---|
| 5,373,184 A | 12/1994 | Moslehi |
| 5,374,564 A | 12/1994 | Bruel |
| 5,376,580 A | 12/1994 | Kish et al. |
| 5,385,632 A | 1/1995 | Goossen |
| 5,429,954 A | 7/1995 | Gerner |
| 5,578,839 A | 11/1996 | Nakamura et al. |
| 5,625,202 A | 4/1997 | Chai |
| 5,661,074 A | 8/1997 | Tischler |
| 5,701,321 A | 12/1997 | Hayafuji et al. |
| 5,728,623 A | 3/1998 | Mori |
| 5,739,554 A | 4/1998 | Edmond et al. |
| 5,753,134 A | 5/1998 | Biebl |
| 5,780,873 A | 7/1998 | Itaya et al. |
| 5,786,606 A | 7/1998 | Nishio et al. |
| 5,798,537 A | 8/1998 | Nitta |
| 5,851,905 A | 12/1998 | McIntosh et al. |
| 5,862,167 A | 1/1999 | Sassa et al. |
| 5,866,468 A | 2/1999 | Kono et al. |
| 5,874,747 A | 2/1999 | Redwing et al. |
| 5,877,070 A | 3/1999 | Goesele et al. |
| 5,880,491 A | 3/1999 | Soref et al. |
| 5,889,295 A | 3/1999 | Rennie et al. |
| 5,917,202 A | 6/1999 | Haitz et al. |
| 5,928,421 A | 7/1999 | Yuri et al. |
| 5,959,307 A | 9/1999 | Nakamura et al. |
| 5,972,781 A | 10/1999 | Wegleiter et al. |
| 5,985,687 A | 11/1999 | Bowers et al. |
| 6,046,464 A | 4/2000 | Schetzina |
| 6,060,335 A | 5/2000 | Rennie et al. |
| 6,060,730 A | 5/2000 | Tsutsui |
| 6,100,044 A | 8/2000 | Evans et al. |
| 6,100,104 A | 8/2000 | Haerle |
| 6,111,272 A | 8/2000 | Heinen |
| 6,120,600 A | 9/2000 | Edmond et al. |
| 6,133,589 A | 10/2000 | Krames et al. |
| 6,150,230 A | 11/2000 | Kotecki et al. |
| 6,222,207 B1 | 4/2001 | Carter-Coman et al. |
| 6,258,618 B1 | 7/2001 | Lester |
| 6,291,839 B1 | 9/2001 | Lester |
| 6,303,405 B1 | 10/2001 | Yoshida et al. |
| 6,319,742 B1 | 11/2001 | Hayashi et al. |
| 6,328,796 B1 | 12/2001 | Kub et al. |
| 6,335,212 B1 | 1/2002 | Uemura et al. |
| 6,347,101 B1 | 2/2002 | Wu et al. |
| 6,350,998 B1 | 2/2002 | Tsuji |
| 6,355,497 B1 | 3/2002 | Romano et al. |
| 6,365,427 B1 | 4/2002 | Gauggel et al. |
| 6,365,429 B1 | 4/2002 | Kneissl et al. |
| 6,380,564 B1 | 4/2002 | Chen et al. |
| 6,420,199 B1 | 7/2002 | Coman et al. |
| 6,420,242 B1 | 7/2002 | Cheung et al. |
| 6,448,102 B1 | 9/2002 | Kneissi et al. |
| 6,468,824 B2 | 10/2002 | Chen et al. |
| 6,495,862 B1 | 12/2002 | Okazaki et al. |
| 6,518,079 B2 | 2/2003 | Imler |
| 6,555,405 B2 | 4/2003 | Chen et al. |
| 6,559,075 B1 | 5/2003 | Kelly et al. |
| 6,562,701 B2 | 5/2003 | Ishida et al. |
| 6,593,159 B1 | 7/2003 | Hashimoto |
| 6,603,146 B1 | 8/2003 | Hata et al. |
| 6,607,931 B2 | 8/2003 | Streubel |
| 6,617,182 B2 | 9/2003 | Ishida et al. |
| 6,617,261 B2 | 9/2003 | Wong et al. |
| 6,620,643 B1 | 9/2003 | Koike |
| 6,677,173 B2 | 1/2004 | Ota |
| 6,711,192 B1 | 3/2004 | Chikuma et al. |
| 6,746,889 B1 | 6/2004 | Eliashevich et al. |
| 6,812,502 B1 | 11/2004 | Chien et al. |
| 6,849,878 B2 | 2/2005 | Bader et al. |
| 6,869,820 B2 | 3/2005 | Chen |
| 6,878,563 B2 | 4/2005 | Bader et al. |
| 6,924,163 B2 | 8/2005 | Okazaki et al. |
| 6,936,859 B1 | 8/2005 | Uemura et al. |
| 6,946,312 B2 | 9/2005 | Kon et al. |
| 6,975,444 B2 | 12/2005 | Huibers |
| 7,265,392 B2 | 9/2007 | Hahn et al. |
| 2001/0022390 A1 | 9/2001 | Waitl et al. |
| 2001/0035580 A1 | 11/2001 | Kawai |
| 2001/0042866 A1 | 11/2001 | Coman et al. |
| 2002/0096102 A1 | 7/2002 | Sloot |
| 2003/0086856 A1 | 5/2003 | D'Evelyn et al. |
| 2003/0131788 A1 | 7/2003 | Ueda |
| 2003/0168664 A1 | 9/2003 | Hahn et al. |
| 2003/0197170 A1 | 10/2003 | Bader et al. |
| 2004/0026709 A1 | 2/2004 | Bader et al. |
| 2004/0222434 A1 | 11/2004 | Uemura et al. |
| 2005/0179051 A1 | 8/2005 | Kondoh et al. |
| 2005/0282373 A1 | 12/2005 | Bader et al. |
| 2006/0011925 A1 | 1/2006 | Bader et al. |
| 2007/0012944 A1 | 1/2007 | Bader et al. |

FOREIGN PATENT DOCUMENTS

| | | |
|---|---|---|
| DE | 29 15 888 | 10/1979 |
| DE | 3508469 | 9/1986 |
| DE | 690 08 931 T2 | 12/1990 |
| DE | 40 38 216 A1 | 7/1991 |
| DE | 43 05 296 A1 | 8/1994 |
| DE | 197 53 492 A1 | 9/1998 |
| DE | 198 30 838 A1 | 1/1999 |
| DE | 197 41 442 A1 | 4/1999 |
| DE | 19743349 | 4/1999 |
| DE | 199 21 987 A1 | 11/1999 |
| DE | 198 38 810 A1 | 3/2000 |
| DE | 100 00 088 A1 | 8/2000 |
| EP | 0051172 | 5/1982 |
| EP | 0 282 075 A2 | 9/1988 |
| EP | 0 317 445 A2 | 5/1989 |
| EP | 0 356 037 A2 | 2/1990 |
| EP | 0 404 565 A1 | 12/1990 |
| EP | 0 740 376 A1 | 10/1996 |
| EP | 0 810 674 A2 | 12/1997 |
| EP | 0 817 283 A1 | 1/1998 |
| EP | 0 871 228 A2 | 10/1998 |
| EP | 0 896 405 A2 | 2/1999 |
| EP | 0 905 797 A2 | 3/1999 |
| GB | 2 322 737 A | 9/1998 |
| GB | 2 346 478 A | 8/2000 |
| JP | 63-224213 | 9/1988 |
| JP | 64-42813 | 2/1989 |
| JP | 11-74558 | 7/1989 |
| JP | 4-212479 | 8/1992 |
| JP | 4-223330 | 8/1992 |
| JP | 04-223330 A | 8/1992 |
| JP | 06045651 | 2/1994 |
| JP | 06-224404 | 8/1994 |
| JP | 07-221347 | 8/1994 |
| JP | 07-142815 | 6/1995 |
| JP | 7335940 A | 12/1995 |
| JP | 08-032116 | 2/1996 |
| JP | 08-064910 | 3/1996 |
| JP | 08-116090 | 5/1996 |
| JP | 08-307001 | 11/1996 |
| JP | 9008403 | 1/1997 |
| JP | 09-129927 | 5/1997 |
| JP | 9-186365 | 7/1997 |
| JP | 09-0223819 A | 8/1997 |
| JP | 10-12921 | 1/1998 |
| JP | 10-150220 | 6/1998 |
| JP | 10-209494 | 8/1998 |
| JP | 10-229217 | 8/1998 |
| JP | 10223496 | 8/1998 |
| JP | 10-290027 | 10/1998 |
| JP | 10-341036 | 12/1998 |
| JP | 11-17223 | 1/1999 |
| JP | 11-068157 | 3/1999 |
| JP | 11068157 | 3/1999 |
| JP | 11-504764 | 4/1999 |
| JP | 11-145515 | 5/1999 |
| JP | 11-150297 A | 6/1999 |
| JP | 11-191641 | 7/1999 |
| JP | 11220168 | 8/1999 |
| JP | 11220171 A | 8/1999 |
| JP | 11251634 A | 9/1999 |
| JP | 11-284228 | 10/1999 |
| JP | 11-330559 | 11/1999 |
| JP | 2000-077713 | 3/2000 |
| JP | 2000-101139 | 4/2000 |

| | | |
|---|---|---|
| JP | 2000-114599 | 4/2000 |
| JP | 2001244503 | 9/2001 |
| TW | 369731 | 9/1999 |
| TW | 441859 | 6/2001 |
| WO | WO 92/13363 | 8/1992 |
| WO | WO 95/00974 | 1/1995 |
| WO | WO 96/09653 | 3/1996 |
| WO | WO 97/48138 | 12/1997 |
| WO | WO 98/14986 | 4/1998 |
| WO | WO 00/19499 | 4/2000 |
| WO | WO 00/34989 | 6/2000 |
| WO | WO 00/49989 | 8/2000 |
| WO | WO 01/41223 A1 | 6/2001 |
| WO | WO 01/47038 A1 | 6/2001 |
| WO | WO 01/47039 A1 | 6/2001 |
| WO | WO 02/15286 | 2/2002 |

OTHER PUBLICATIONS

Office Action for U.S. Appl. No. 11/755,284 dated Nov. 26, 2008.
Office Action for U.S. Appl. No. 11/067,349 dated Oct. 17, 2008.
Office Action for U.S. Appl. No. 11/508,504 dated Aug. 23, 2006.
Office Action dated Jan. 25, 2008 (with English translation) issued for the corresponding Chinese Patent Application No. 200610136532.3.

T. Margalith, et al., "Indium tin Oxide contacts to gallium nitride optoelectronic deices", Applied Physics Letters, vol. 74, No. 26, Jun. 28, 1999.

J-L Lee, et al., "Ohmic contact formation mechanism of nonalloyed Pd contacts to p-type GaN observed by positron annihilation spectroscopy", Applied Physics Letters, vol. 74, No. 16, Apr. 19, 1999.

A.J. Steckl et al., "Growth and Characterization of GaN thin Films on SiC SOI substrates", Journal of Electronic Materials, vol. 25, No. 3, 1997.

I. Schnitzer and E. Yablonovitch: "30% external quantum efficiency from surface textured, thin-film light-emitting diodes", Applied Physics, Letter 63, Oct. 18, 1993, p. 2174.

Mensz, P.M., et al.: "InxGa1-xN/AlyGa1-yN violet light emitting diodes with reflective p-contacts for high single sided light extraction", Electronic Letters, vol. 33, No. 24, Nov. 20, 1997, pp. 2066-2068.

Wong, W.S. et al.: "Fabricant of Thin-Film InGaN Light-Emitting Diode Membranes by Laser Lift-Off", American Institute of Physics, Applied Physics Letters, vol. 75, No. 10, Sep. 6, 1999, pp. 1360-1362.

Von Ardenne, M.: Tabellen zur angewandten Physik {\[tables for Applied Physics], VEB Deutscher Verlag der Wissenschaften, Berlin, 1973, pp. Coversheet and 168-169.

METHOD FOR FABRICATING A SEMICONDUCTOR COMPONENT BASED ON GAN

CROSS-REFERENCE TO RELATED APPLICATION

This application is a continuation of U.S. patent application Ser. No. 10/417,611 filed Apr. 17, 2003, now U.S. Pat. No. 7,691,656 which is a continuation of International Application No. PCT/DE01/03851, filed Oct. 8, 2001, which claims priority to German Patent Application No. 10051465.0 filed Oct. 17, 2000.

BACKGROUND OF THE INVENTION

Field of the Invention

The invention relates to a method for fabricating a semiconductor component having a plurality of GaN-based layers.

Semiconductor components based on GaN are used predominantly to generate radiation in the blue-green spectral region and have a plurality of layers that are formed of a GaN-based material. In addition to GaN itself, materials of this type also include materials derived from GaN or related to GaN and also ternary or quaternary mixed crystals built up on the basis of this structure. These materials include, in particular, AlN, InN, AlGaN, ($Al_{1-x}Ga_xN$, $0 \leq x \leq 1$), $In_{1-x}Ga_xN$, $0 \leq x \leq 1$), InAlN ($In_{1-x}Al_xN$, $0 \leq x \leq 1$) and AlInGaN ($Al_{1-x-y}In_xGa_yN$, $0 \leq x \leq 1$, $0 \leq y \leq 1$). In the text that follows, the term "GaN-based" relates to these materials systems as well as GaN itself.

Epitaxy processes are usually used to fabricate GaN-based semiconductor components. The choice of an epitaxy substrate is of crucial importance both to the fabrication process and to the function of the component.

Sapphire or SiC substrates are often used for this purpose, but both entail certain drawbacks. For example, the lattice mismatch of sapphire with respect to GaN-based layers is relatively high.

In this respect, SiC substrates have better lattice matching to GaN-based materials. However, the fabrication of SiC substrates with sufficient crystal quality is associated with very high costs. Moreover, the yield of GaN-based semiconductor components is relatively low, since the size of SiC wafers is limited to diameters of typically well below 150 mm.

U.S. Pat. No. 5,786,606 discloses a method for fabricating radiation-emitting semiconductor components based on GaN in which an SiC layer is grown epitaxially on a SIMOX substrate (Separation by Implantation of Oxygen substrate) or a SOI substrate (Silicon On Insulator). Then, a plurality of GaN-based layers are deposited on the SiC layer.

However, the SiC layer reduces the radiation output of the component, since some of the radiation generated is absorbed in the SiC layer. Furthermore, the epitaxial formation of a SiC layer with sufficient crystal quality also requires a high level of fabrication outlay.

SUMMARY OF THE INVENTION

It is accordingly an object of the invention to provide a method for fabricating a semiconductor component based on GaN that overcomes the above-mentioned disadvantages of the prior art methods of this general type, which is technically simple and inexpensive. The invention further relates to fabricating semiconductor components having an increased radiation output.

With the foregoing and other objects in view there is provided, in accordance with the invention, a method for an epitaxial fabrication of a semiconductor component. The method includes providing a composite substrate having a substrate body with a given coefficient of thermal expansion, and an interlayer, and applying GaN-based layers to the interlayer of the composite substrate. The given coefficient of thermal expansion of the substrate body being equal to or greater than a coefficient of thermal expansion of the GaN-based layers.

In the fabrication method according to the invention, a plurality of GaN-based layers are applied epitaxially to a composite substrate which includes a substrate body and an interlayer, the coefficient of thermal expansion of the substrate body being similar to or greater than the coefficient of thermal expansion of the GaN-based layers.

In a plurality of GaN-based layers of different composition, the coefficient of thermal expansion of the layers also differs. However, these deviations are generally minor and are negligible compared to the difference from the coefficient of thermal expansion of the substrate body. The crucial coefficient of thermal expansion of the GaN-based layers is primarily the coefficient of thermal expansion of the layer that adjoins the composite substrate. Furthermore, depending on the structure of the layer sequence, the coefficient of thermal expansion of the GaN-based layer which has the greatest thickness or the mean of the coefficients of thermal expansion, if appropriate weighted according to the respective layer thicknesses, can also be used for this purpose.

In the invention, the coefficient of thermal expansion of the substrate body is greater than or similar to the coefficient of thermal expansion of the GaN-based layers. In the latter case, the coefficient of thermal expansion of the substrate body preferably deviates by no more than 50%, particularly preferably by no more than 30%, from the expansion coefficient of the GaN-based layers.

A composite substrate is to be understood as meaning a substrate that includes at least two regions, the substrate body and the interlayer, and as such forms the starting substrate for the epitaxy process. In particular, the interlayer is applied to the substrate body not by epitaxy but rather preferably by a bonding process.

A suitable bonding process is preferably an oxidic bonding process or a wafer bonding process. In the case of oxidic bonding, substrate body and interlayer are joined to one another by the formation of an oxide layer, for example a silicon oxide layer, as a bonding layer, while in the case of wafer bonding the substrate body and the interlayer are joined to one another directly. Furthermore, it is also possible to use other bonding processes, for example eutectic bonding processes or bonding processes in which a nonoxidic bonding layer is formed.

With a composite substrate of the type described, the thermal properties are determined primarily by the substrate body, while, substantially independently of this, the epitaxy surface and in particular its lattice constant are defined by the interlayer. As a result, the interlayer can advantageously be optimally matched to the lattice constant of the layers that are to be applied. At the same time, the use of a substrate body with a sufficiently high coefficient of thermal expansion prevents tensile distortion to the GaN-based layers during the cooling phase after they have been applied, which would result in the formation of cracks in the layers. Therefore, the interlayer is preferably configured to be so thin that the coefficient of thermal expansion of the composite substrate as a whole substantially corresponds to the expansion coefficient of the substrate body. The substrate body is typically at least twenty times thicker than the interlayer.

In an advantageous configuration of the invention, the substrate body contains SiC, Si or GaN, preferably polycrystalline (poly-SiC, poly-Si or poly-GaN), sapphire or AlN. The coefficient of thermal expansion of SiC is similar to the expansion coefficient of GaN-based materials, while the other materials mentioned have a higher coefficient of thermal expansion than GaN-based materials. This advantageously avoids the formation of cracks during cooling of the epitaxially applied layers.

In a preferred configuration of the invention, the interlayer contains SiC, silicon, sapphire, MgO, GaN or AlGaN. These materials are particularly suitable for forming a substantially monocrystalline surface with a lattice constant which is matched to GaN. The epitaxy surface used is preferably a Si(111) surface or a monocrystalline SiC surface on which the GaN-based layers are grown.

In an advantageous refinement of the invention, the GaN-based layers are deposited on a composite substrate in which the interlayer has been applied to the substrate body by a bonding process, for example a wafer bonding process or an oxidic bonding process. It is preferable for a bonding layer, for example of silicon oxide, to be formed between substrate body and interlayer.

A bonding process advantageously allows a wide range of materials systems to be combined without having to be constrained by incompatibility between the materials, as occurs, for example, when an interlayer is applied epitaxially to a substrate body.

To obtain a sufficiently thin interlayer, it is also possible for a thicker interlayer to be bonded to the substrate body and then to be thinned to the thickness required, for example by grinding or cleaving.

In an advantageous refinement of the invention, before the GaN-based layers are deposited on the composite substrate, a mask layer is formed, with the result that the GaN-based layers only grow on the regions of the epitaxy surface that are not covered by the mask. As a result, the GaN-based layers are advantageously interrupted in the layer plane, resulting in additional protection against tensile distortion and the associated formation of cracks.

A further preferred configuration of the invention consists in patterning the GaN-based layers into individual semiconductor layer stacks after they have been deposited on the composite substrate. Then, a carrier is applied to the GaN-based semiconductor layer stacks, and the composite substrate is removed. The composite substrate can therefore be reused at least in part. This constitutes a particular advantage in the case of SiC substrate bodies, the fabrication of which entails very high costs. Furthermore, in this way a thin-film component is fabricated. In this context, a thin-film component is to be understood as meaning a component which does not include an epitaxy substrate.

In this way, in the case of radiation-emitting semiconductor components, the radiation output is increased, since absorption of the generated radiation in the epitaxy substrate, as occurs in particular with SiC substrates, is avoided.

Examples of suitable materials for the carrier include GaAs, germanium, silicon, zinc oxide or metals, in particular molybdenum, aluminum, copper, tungsten, iron, nickel, cobalt or alloys thereof.

The carrier material is preferably selected in such a way that its coefficient of thermal expansion is matched to the coefficient of thermal expansion of the GaN-based layers and if appropriate to the coefficient of thermal expansion of the substrate body. It is expedient for the coefficient of thermal expansion of the carrier material to be matched to the coefficient of thermal expansion of the substrate body in particular if the temperature is changed between the application of the carrier and the removal of the GaN-based layers from the composite substrate. Very divergent coefficients of thermal expansion would lead to considerable expansion of carrier and composite substrate and thereby increase the risk of damage to the GaN-based layers between them as a result of excessive mechanical stresses.

It is advantageous to match the coefficients of thermal expansion of carrier and GaN-based layers in order to keep mechanical stresses, which may occur on the one hand after fabrication of the semiconductor bodies during a cooling phase and on the other hand in operation, for example as a result of heating through power losses, at a low level.

Matched coefficients of thermal expansion are in particular characterized by the difference between them being so low that the temperature changes which occur cause substantially no damage to the GaN-based layers as a result of thermally induced mechanical stresses. The relative deviation of the coefficient of thermal expansion of the carrier from the coefficient of thermal expansion of the composite substrate should preferably be less than 50%, particularly preferably less than 30%.

The temperature changes which occur are caused, for example, by the process used to separate the GaN-based layers from the composite substrate, the temperature which prevails during fabrication, in particular during application of the carrier, compared to the intended operating temperature, and/or the power loss which is to be expected on the basis of the operating specifications.

The carrier material is preferably selected in such a way that the coefficient of thermal expansion of the carrier is between the coefficient of thermal expansion of the substrate body and the coefficient of thermal expansion of the GaN-based layers. The coefficient of thermal expansion of the carrier is particularly preferably greater than the arithmetic mean of the coefficients of thermal expansion of composite substrate and GaN-based layers.

The so-called transfer bonding of the semiconductor layer stacks from the composite substrate to a carrier which is described may also, according to the invention, take place in two steps, in which case the GaN-based semiconductor layer stacks are bonded to a temporary carrier and are then bonded to the actual carrier, so that ultimately the actual carrier replaces the composite substrate. Semiconductor layer stacks fabricated in this way advantageously have a corresponding layer sequence to GaN-based semiconductor bodies with epitaxy substrate in accordance with the prior art, so that the same subsequent process steps, such as for example separation, contact-making and installation in a housing, can be used for both layer stacks.

In a particularly preferred refinement of the method for fabricating radiation-emitting semiconductor bodies based on GaN, a reflector layer is formed on the semiconductor layer stack in order to increase the radiation output. The radiation output of GaN-based semiconductor components is largely limited by reflection at the semiconductor body interfaces, on account of the high refractive index of GaN-based materials. In the case of radiation-emitting semiconductor bodies without an absorbent substrate, it is advantageously possible for the radiation components that are reflected at the output surface to be returned to the output surface by a reflector layer. This further increases the radiation output.

The reflector layer is preferably formed as a metal layer which contains, for example, aluminum, silver or a corresponding aluminum or silver alloy.

A metal layer of this type can advantageously also be used as a contact surface. Alternatively, the reflector layer may also be formed by a dielectric mirror coating in the form of a plurality of dielectric layers.

In an advantageous refinement of the invention, at least part of the surface of the semiconductor layer stack is roughened. This interferes with total reflection at the surface and thereby increases the radiation output. The roughening is preferably effected by etching or a sand-blasting process.

Other features which are considered as characteristic for the invention are set forth in the appended claims.

Although the invention is illustrated and described herein as embodied in a method for fabricating a semiconductor component based on GaN, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
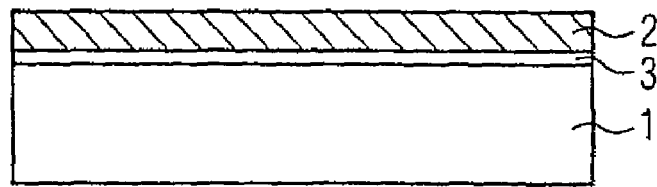
FIGS. 1A-1G are diagrammatic, sectional views through a first exemplary embodiment of a fabrication method according to the invention.

In all the figures of the drawing, sub-features and integral parts that correspond to one another bear the same reference symbol in each case. Referring now to the figures of the drawing in detail and first, particularly, to FIGS. 1A-1G thereof, there is shown a fabrication method. A composite substrate has a substrate body 1 made from poly-SiC to which a monocrystalline SiC interlayer 2 has been bonded in a known way is used. For this bonding, a bonding layer 3, for example of silicon oxide, has been formed between the substrate body 1 and the interlayer 2, see FIG. 1A.

Figure 1B:
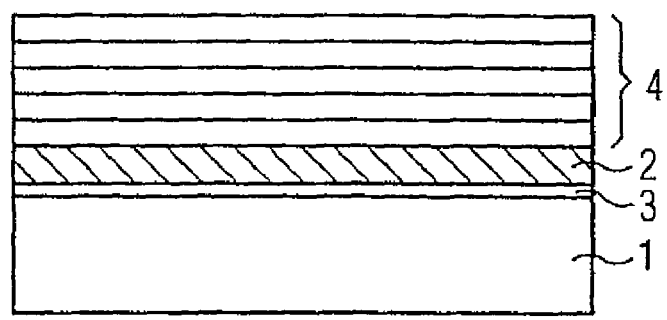

A plurality of GaN-based layers 4 are grown epitaxially onto the composite substrate, FIG. 1B. The structure of the layer sequence is not in principle subject to any particular restrictions.

In this case, it is preferable to form an active layer that is used to generate radiation and is surrounded by one or more cladding layers and/or waveguide layers. The active layer may in this case be formed by a plurality of thin individual layers in the form of a single or multiple quantum well structure.

Furthermore, it is advantageous to form a buffer layer, for example based on AlGaN, on the interlayer 2, making it possible to improve the lattice matching and wettability with respect to the subsequent layers. To increase the electrical conductivity of a buffer layer of this type, electrically conductive passages, for example based on InGaN, may be included in the buffer layer.

Figure 1C:
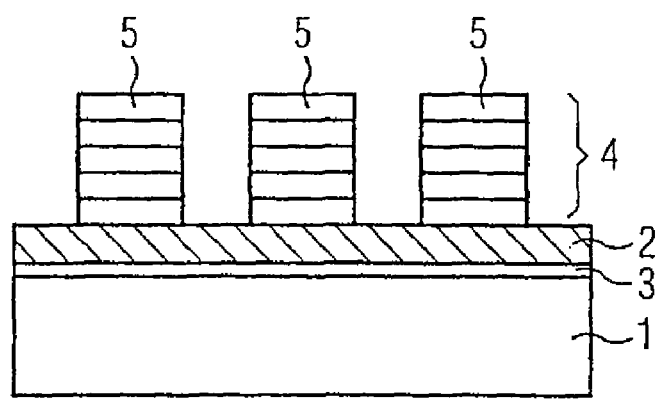

Then, the GaN-based layers 4 are divided into individual semiconductor layer stacks 5 by lateral patterning, preferably by mesa etching, FIG. 1C.

Figure 1D:
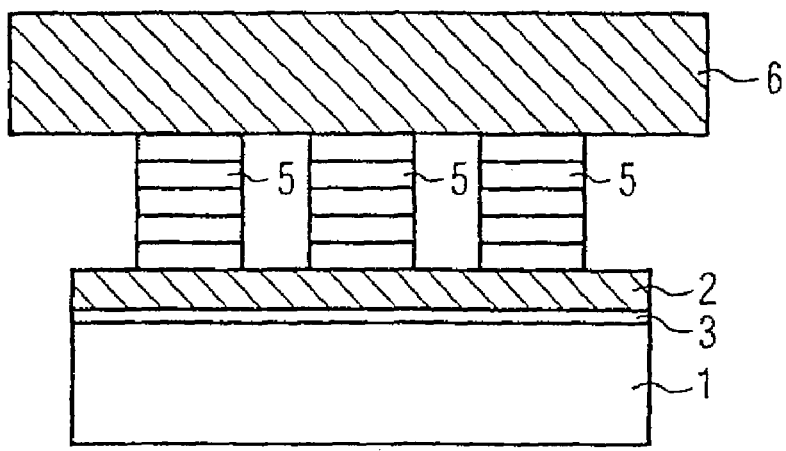

In the next step, FIG. 1D, a carrier 6, for example made from GaAs or a material which transmits the radiation which is generated, is applied to the semiconductor layer stacks 5.

Figure 1E:
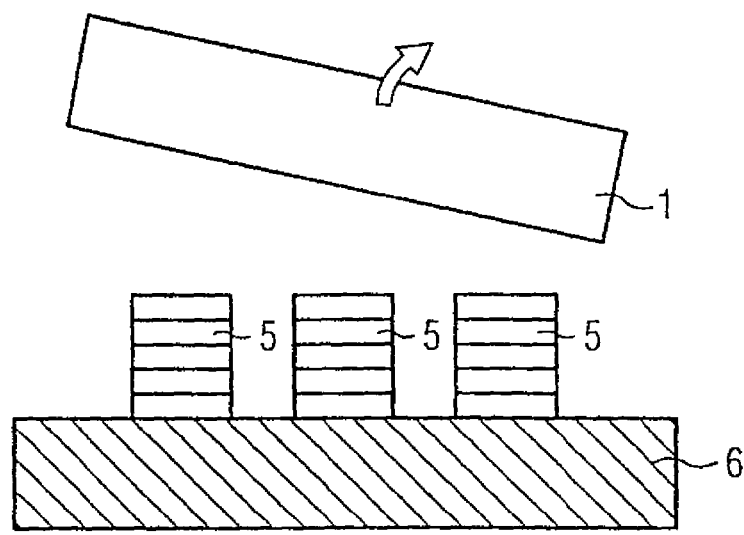

Then, the composite substrate 1, 2, 3 including the interlayer 2 is removed from the semiconductor layer stacks 5, FIG. 1E. This can be achieved, for example, by an etching process in which the interlayer 2 or the bonding layer 3 is destroyed. Furthermore, the composite substrate can also be removed by a laser ablation process, in which case a substrate body that transmits the laser radiation used, for example a sapphire substrate body, is expediently used. The laser radiation can thereby be radiated through the substrate body onto the interlayer or the bonding layer. The substrate body 1 can advantageously be reused in a further fabrication cycle.

If the temperature is changed between the application of the carrier and the removal of the composite substrate, it is particularly expedient to match the coefficients of thermal expansion of the carrier and the substrate body. By way of example, in combination with a sapphire substrate body, a suitable carrier contains GaAs, molybdenum, tungsten or an Fe—Ni—Co alloy. By way of example, a eutectic bonding process can be used to apply a metallic carrier.

In combination with a SiC substrate body, a material that contains silicon or SiC, in each case in monocrystalline or preferably polycrystalline form, is an advantageous carrier material. In this context, by way of example, an oxidic bonding process is suitable for application of the carrier.

Figure 1F:
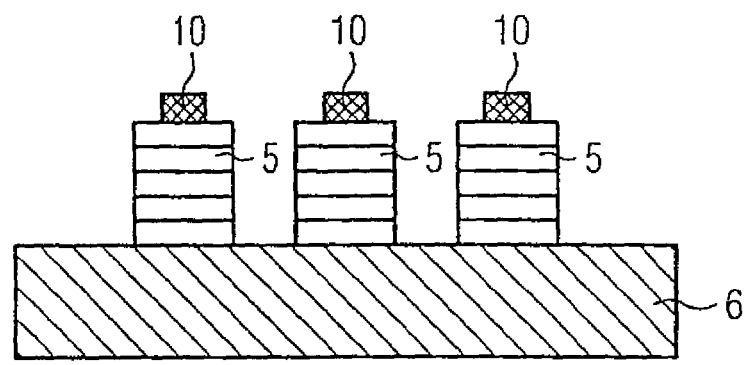
Figure 1G:
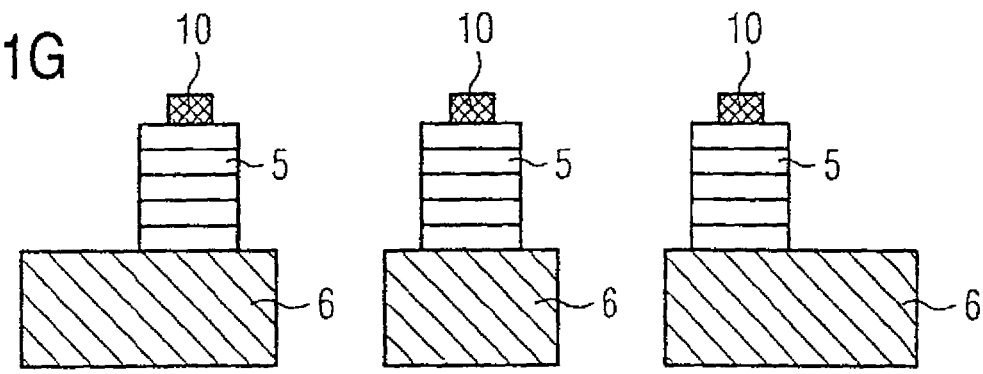

Then, contact surfaces 10 are applied to the thin-film semiconductor bodies 5 formed in this way, FIG. 1F. Finally, the semiconductor layer stacks 5 are separated from one another, FIG. 1G, and processed further in the usual way.

In the fabrication method illustrated in FIGS. 2A-2I, the starting point is once again the composite substrate which is substantially formed by the poly-SiC substrate body 1 and the Si(111) interlayer 2. The interlayer 2 has been applied to the substrate body 1 with the aid of an oxidic bonding process to form the silicon oxide bonding layer 3, FIG. 2A. Alternatively, the substrate body 1 and the interlayer 2 may also be joined by another bonding process, for example wafer bonding.

Figure 2A:
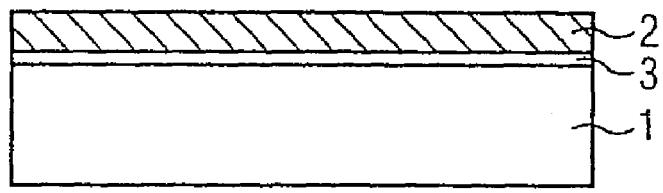
FIGS. 2A-2I are diagrammatic, sectional views through a second exemplary embodiment of a fabrication method according to the invention.
Figure 2B:
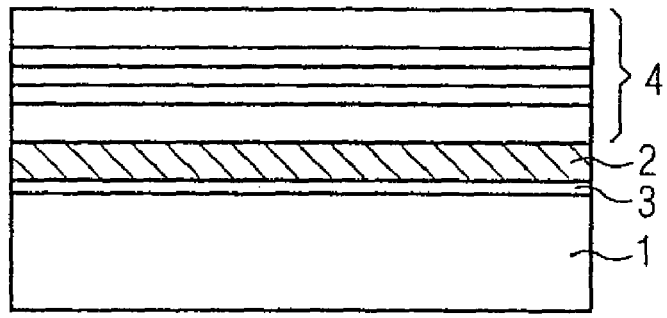
Figure 2C:
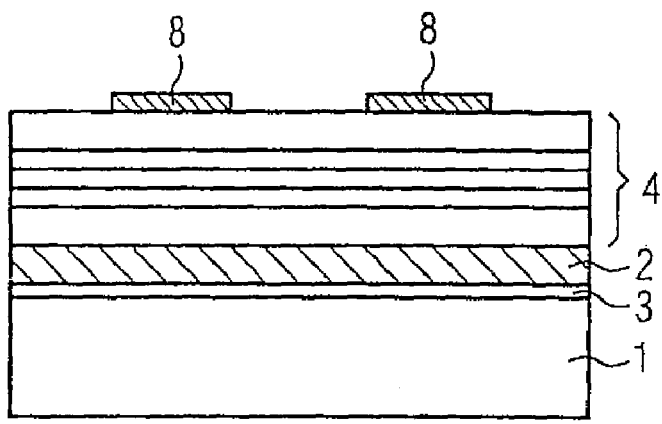

Once again, a plurality of GaN-based layers 4 are grown onto the composite substrate, FIG. 2B, and finally these layers are provided with a contact layer 8, for example of platinum, FIG. 2C.

Figure 2D:
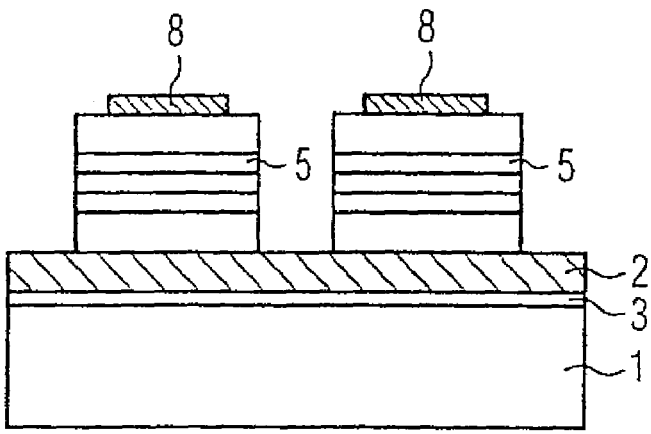

Then, the GaN-based layers 4 are divided into individual semiconductor layer stacks 5 by etch patterning, FIG. 2D.

Figure 2E:
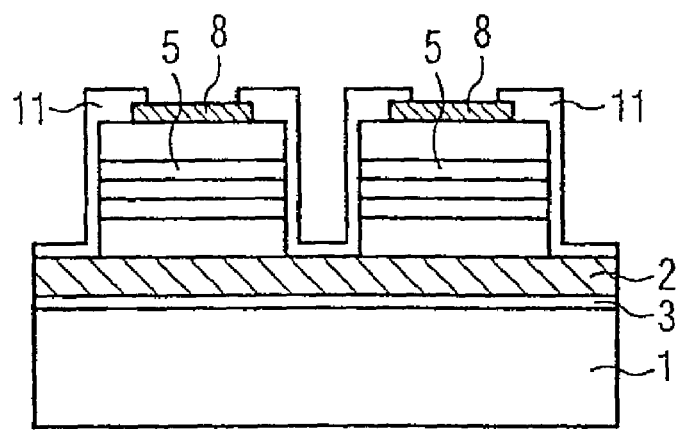

For protection purposes, a passivation layer 11, preferably based on silicon nitride, is applied to the semiconductor layer stacks 5 which have been formed in this way, FIG. 2E.

Figure 2F:
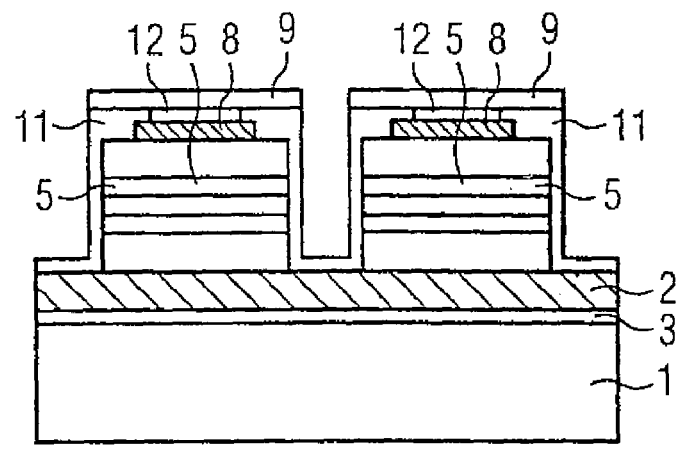

Then, a bonding solder 12 followed by a reflector 9 containing a silver or aluminum alloy are deposited on the regions of the contact layer 8 which are not covered by the passivation layer, FIG. 2F.

Figure 2G:
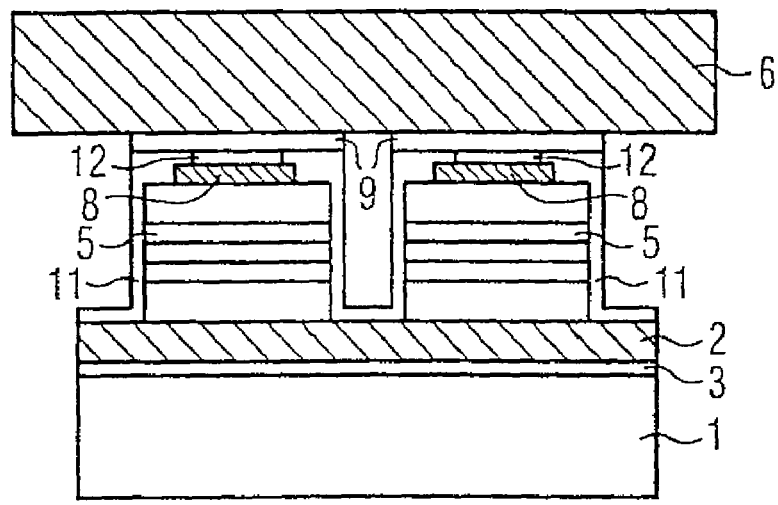

Then, the semiconductor layer stacks 5 with the reflector 9 are transfer-bonded to the carrier 6 by use of a eutectic bonding process, FIG. 2G.

Figure 2H:
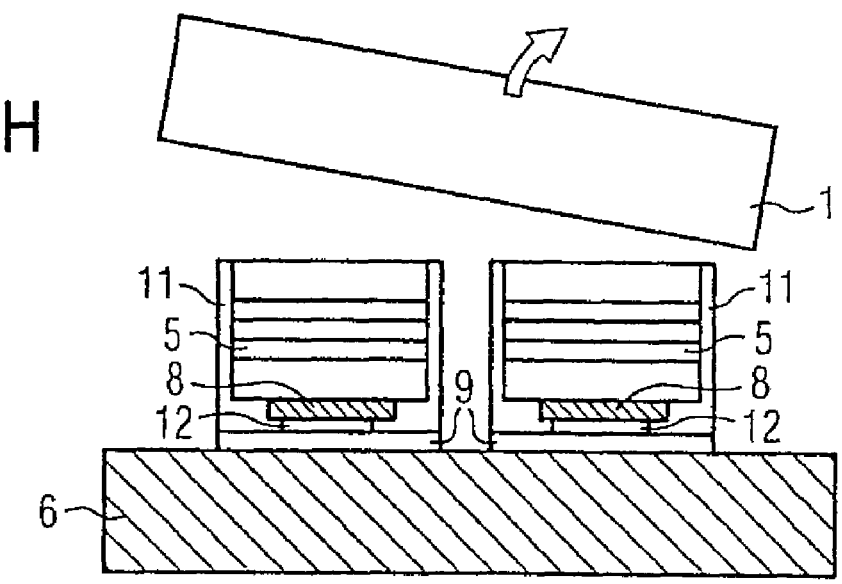

In the next step, FIG. 2H, the substrate body 1 is removed and can thereby be reused.

Figure 2I:
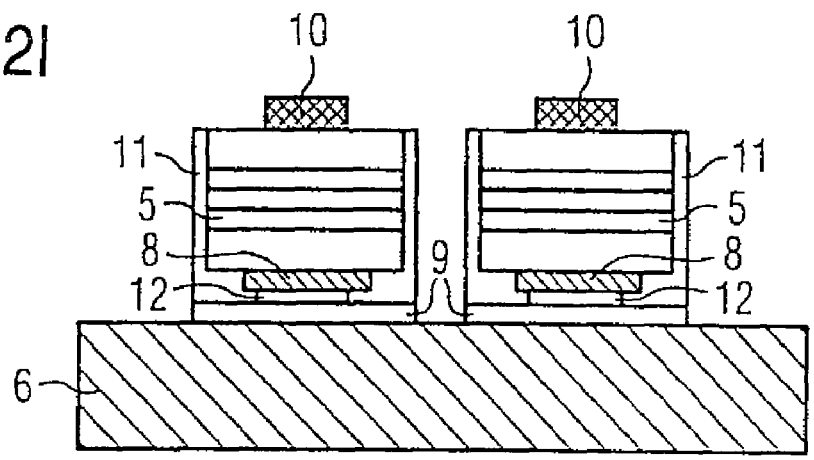

Finally, the top side of the individual semiconductor layer stacks is provided with contact surfaces 10, FIG. 2I. The semiconductor layer stacks can then be separated from one another and if appropriate fitted into non-illustrated housings.

Figure 3A:
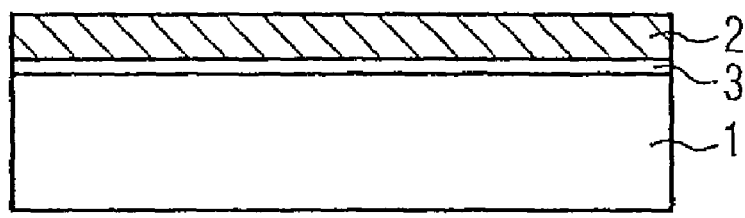
FIGS. 3A-3C are diagrammatic, sectional views through a third exemplary embodiment of a fabrication method according to the invention.
Figure 3B:
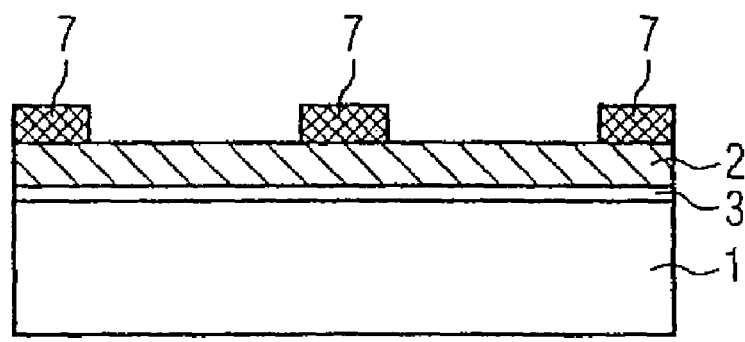
Figure 3C:
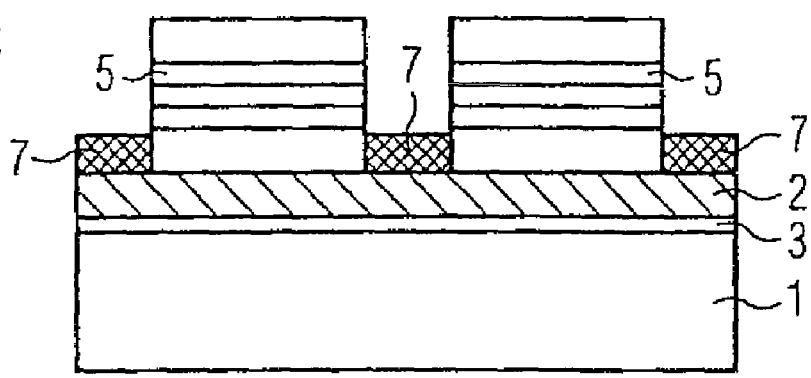

The exemplary embodiment of a fabrication method according to the invention that is illustrated in FIGS. 3A-3C represents a variant on the exemplary embodiments described above.

Once again, as described above, the epitaxy substrate used is a composite substrate, FIG. 3A.

Prior to the deposition of the GaN-based layers 4, a mask layer 7 is applied to the epitaxy surface of the interlayer 2, FIG. 3B. Consequently, the GaN-based layers 4 only grow on those regions of the epitaxy surface which are not covered by the mask layer 7 (epitaxy windows), FIG. 3C. As a result, the GaN-based layers 4 are interrupted in the direction of the layer plane. This additionally avoids tensile stresses in the epitaxially deposited layers during the cooling phase.

The fabrication method can then be continued as in the other exemplary embodiments.

Of course, the explanation of the invention that has been given on the basis of the exemplary embodiments described is not to be understood as constituting any limitation to the invention, but rather the invention encompasses all embodiments that make use of the inventive idea.

We claim:

1. A method for an epitaxial fabrication of a thin-film light emitting-diode, the method comprising the steps of:
    forming GaN-based layers on a substrate which comprises sapphire, the GaN-based layers comprising an active layer sequence for emitting radiation;
    patterning the GaN-based layers into individual semiconductor layer stacks after they have been deposited on the substrate comprising sapphire;
    applying an electrically conductive carrier to the semiconductor layer stacks on a side of the semiconductor layer stacks which faces away from the substrate comprising sapphire and subsequently removing the substrate comprising sapphire such that the substrate comprising sapphire can be reused at least in part;
    forming a contact surface on surfaces of the semiconductor layer stacks from which the substrate comprising sapphire has been removed; and
    separating the semiconductor layer stacks from each other into a plurality of thin-film light-emitting diodes.

2. The method of claim 1, wherein the substrate comprising sapphire consists of sapphire.

3. The method of claim 1, wherein the substrate comprising sapphire has a coefficient of thermal expansion deviating by no more than 50% from a coefficient of thermal expansion of the GaN-based layers.

4. The method of claim 1, wherein the substrate comprising sapphire is removed by a laser ablation process.

5. The method of claim 4, wherein a laser radiation of said laser ablation process is radiated through at least a part of the substrate comprising sapphire.

6. The method of claim 1, wherein the carrier comprises germanium.

7. The method of claim 1, wherein the carrier consists of germanium.

* * * * *